United States Patent
Kean et al.

(12) 
(10) Patent No.: US 6,426,522 B1
(45) Date of Patent: Jul. 30, 2002

(54) DOPED SEMICONDUCTOR MATERIAL, A METHOD OF MANUFACTURING THE DOPED SEMICONDUCTOR MATERIAL, AND A SEMICONDUCTOR DEVICE

(75) Inventors: Alistair Henderson Kean, Oxfordshire (GB); Haruhisa Takiguchi, Chiba (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/594,230

(22) Filed: Jun. 14, 2000

(30) Foreign Application Priority Data

Jun. 16, 1999 (GB) .............................................. 9913900

(51) Int. Cl.[7] .......................................... H01L 31/072
(52) U.S. Cl. ........................................ 257/191; 257/101
(58) Field of Search ..................... 372/50, 46; 257/191, 257/101, 102, 285, 596; 438/936, 36

(56) References Cited

U.S. PATENT DOCUMENTS

| | | | | |
|---|---|---|---|---|
| 4,727,556 A | * | 2/1988 | Burnham et al. ............. 372/50 |
| 4,871,690 A | | 10/1989 | Holonyak, Jr. et al. | |
| 5,254,863 A | * | 10/1993 | Battersby ................... 257/191 |
| 5,376,583 A | * | 12/1994 | Northrup et al. .......... 438/936 |
| 5,395,793 A | * | 3/1995 | Charbonneau et al. ...... 438/936 |
| 5,708,674 A | * | 1/1998 | Beernink et al. ............. 372/50 |
| 5,717,707 A | * | 2/1998 | Beernink et al. ............. 372/46 |
| 5,766,981 A | * | 6/1998 | Thornton et al. ............ 438/36 |

FOREIGN PATENT DOCUMENTS

| | | |
|---|---|---|
| EP | 0475618 | 3/1992 |
| GB | 1349219 | 4/1974 |
| JP | 5856329 | 4/1983 |
| WO | 9736318 | 10/1997 |

* cited by examiner

Primary Examiner—David Nelms
Assistant Examiner—Bau Le
(74) Attorney, Agent, or Firm—Renner, Otto, Boisselle & Sklar, LLP

(57) ABSTRACT

A semiconductor layer is co-doped with two dopants. The first dopant is to generate charge carriers in the semiconductor material, and the second dopant is to promote atomic disorder within the material. When the semiconductor material is annealed, the second dopant becomes mobile and moves through the lattice so as to promote atomic disorder. This eliminates unwanted effects such as, for example, a reduction in the forbidden bandgap that can otherwise arise as a result of atomic ordering. The amount of diffusion of the second dopant during the annealing can be increased by making the initial concentration of the second dopant non-uniform over the volume of the semiconductor material.

20 Claims, 5 Drawing Sheets

A schematic of a standard laser diode structure

Before annealing the co-doped material
contains defects due to ordering.

After annealing the co-doped material
is disordered, with high electrical activity.

Before annealing the p-type region of the laser is delta doped with Be and uniformly doped with C. At this stage the region is still ordered.

After annealing the p-type region of the laser has become uniformly doped with both Be & C. The ordering in the region has been minimised A schematic of a laser structure utilising co-doping to produce disordered, highly conductive doped regions, after annealing

DOPED SEMICONDUCTOR MATERIAL, A METHOD OF MANUFACTURING THE DOPED SEMICONDUCTOR MATERIAL, AND A SEMICONDUCTOR DEVICE

BACKGROUND OF THE INVENTION

1. Field of the Invention

The present invention relates to a doped semiconductor material and, in particular, to a doped semiconductor material having a good electrical conductivity and a large forbidden bandgap. The present invention also relates to a method of manufacturing such a doped semiconductor material, and to a semiconductor device incorporating a layer of this material.

2. Description of the Related Art

One well-known compound semiconductor system is the (Al,Ga,In)P system. A compound belonging to the (Al,Ga,In)P system has the general formula $(Al_xGa_{1-x})_{1-y}In_yP$ where both x and y are between 0 and 1.

The (Al,Ga,In)P system is widely used in the fabrication of semiconductor layer structures including, for example, optoelectronic devices such as semiconductor laser devices. One advantage of this semiconductor system is that it is lattice-matched to a gallium arsenide substrate when the indium mole fraction, y, is equal to 0.48.

As is well-known, compound semiconductors such as (Al,Ga,In)P can be "doped" by intentionally introducing impurities into the semiconductor. These intentional impurities, known as "dopants", generate free charge carriers in the semiconductor material, and thus change its electrical properties. In a "n-doped" semiconductor material the majority of the free charge carriers are electrons, whereas in a "p-doped" material the majority of the free charge carriers are holes.

Laser devices or laser diodes (LDs) fabricated in the (Ga,Al,In)P system which emit light in the 630 nm–680 nm wavelength range are becoming increasingly important components of professional and consumer systems. For example, it is envisaged that the Digital Video Disc (DVD) system will employ a 635 nm–650 nm wavelength LD capable of delivering 5 mW power output up to a temperature of 60° C. The next generation of semiconductor lasers will need an even greater maximum power output up to the same or higher (e.g. 70° C.) operating temperatures.

FIG. 1 is a schematic view of a semiconductor laser device. The laser device 1 consists of a substrate 2, on which is disposed, in sequence, an n-doped cladding layer 3, a waveguide 4, an active region 5, another waveguide 6, and a p-doped cladding layer 7. In this laser device, light is generated in the active region 5. Light generated in the active region 5 is confined in the vertical direction in FIG. 1 by the waveguides 4, 6. This is done, for example, by ensuring that the refractive index of the waveguides 4, 6 is greater than the refractive index of the active region 5.

The substrate 2 primarily serves to provide mechanical strength for the laser diode. The laser diode is produced by depositing the layer 3–7 sequentially on the substrate 2. This can be done in principle by any conventional semiconductor growth technique, although it is preferred to use MBE (Molecular Beam Epitaxy) or CVD (Chemical Vapour Deposition) since these methods produce materials having high purity and well-defined geometry.

The upper and lower cladding layers 3, 7 serve to confine carriers within the active region. It is therefore necessary for the cladding layers 3, 7 to have a greater forbidden bandgap than the active region 5. The efficiency of the confinement of carriers in the active region improves as the difference in bandgap between the cladding layers and the active region increases, so that it is desirable to maximise the difference between the bandgap of the cladding layers and the bandgap of the active layer.

A principal limitation of current (Al,Ga,In)P LDs is that they are incapable of operating for long periods (or with a sufficiently low threshold current) at the highest specified operating temperatures. It is generally believed that this is caused by electron leakage from the active layer of the device into the surrounding optical guiding region and subsequently into the p-type cladding region.

When a laser diode having the structure shown in FIG. 1 is fabricated in the (Al,Ga,In)P system, in one example, the active region 5 is a (Ga,In)P active region, the optical guiding layers 4,6 are $(Al_{0.5}Ga_{0.5})_{0.52}In_{0.48}P$, and the cladding layers 3, 7 are $(Al_{0.7}Ga_{0.3})_{0.52}In_{0.48}P$. Typical ranges for the thicknesses of the layers are 0.5–4 $\mu$m for the cladding layers 3, 7, 0.005–1 $\mu$m for the waveguides 4,6, and 0.001–1 $\mu$m for the active region 5. The cladding layers 3, 7 are doped, with the upper cladding layer being p-type and the lower cladding layer being n-type. Thus, in order to fabricate a laser diode having the structure shown in FIG. 1 in the (Al,Ga,In)P system, it is necessary to produce doped (Al,Ga,In)P layers to serve as the upper and lower cladding layers 3, 7. As indicated above, it is essential that these cladding layers have a greater forbidden bandgap than the active region 5, so as to confine carriers in the active region thereby enabling generation of light to occur, and it is desirable to maximise the difference between the bandgap of the cladding layer and the bandgap of the active layer.

One problem encountered in fabricating a laser diode in the (Al,Ga,In)P system is that it is energetically favourable for an (Al,Ga,In)P material to exhibit atomic ordering. This is disclosed in "Nature and Origin of Atomic Ordering in III–V Semiconductor Alloys" by A. G. Norman et al., Inst. Phys. Conf. Ser. No. 134, Section 6, pp. 279–290, 1993. It is known that this ordering causes a reduction in the forbidden bandgap of (Al,Ga,In) P materials. For example, a reduction in the forbidden bandgap of $Ga_{0.5}In_{0.5}P$ is disclosed in Applied Physics Letters Vol. 50 (11), 1987, pp. 673–675. Atomic ordering in the (Al,Ga,In)P system may also cause structural degradation of the material, and thus lead to device failure. It is therefore desirable to reduce the amount of atomic ordering that occurs in the material by as much as possible.

Atomic ordering may occur in any semiconductor system where more than two elements are competing for the same atomic site.

Atomic ordering occurs in the (Al,Ga,In)P system because the size of an In atom differs from the size of either a Ga atom or an Al atom. The presence of two differently sized sites for group III atoms leads to a segregation of In atoms from Al and Ga atoms. This leads to formation of the following:

Anti phase domains;

Anti phase domain boundaries; and

Platelets that are In-rich.

The In-rich platelets locally reduce the forbidden bandgap of the semiconductor layer. The platelets have dimensions typically in the range 10–1,000 Å(1–100 nm).

One approach to reducing atomic ordering is growing an (Al,Ga,In)P layer on an "off-axis" substrate. An "off-axis" substrate is a substrate in which the surface of the substrate on which the semiconductor layer is grown is slightly misoriented from the crystal plane. For example, rather than the growth surface being the (100) crystal plane, it could be misoriented by a few degrees towards the (111) crystal plane.

Another prior art method of reducing atomic ordering in a semiconductor material is to anneal the material. Annealing a semiconductor material, at a temperature typically in the range of 500° C. to 1,000° C., reduces atomic ordering by causing redistribution of atoms within the lattice. This redistribution of atoms is promoted if the material contains impurities which become mobile during the annealing, since such impurities will aid the redistribution of atoms.

Although it is relatively straightforward to reduce atomic ordering in an undoped semiconductor material by annealing it, difficulties occur in annealing a doped semiconductor layer such as a doped (Al,Ga,In)P semiconductor layer. One common p-type dopant for (Al,Ga,In)P is beryllium, but beryllium is known to diffuse through a host lattice at temperatures of greater than around 500° C. Thus, annealing a beryllium-doped (Al,Ga,In)P layer will cause the beryllium to diffuse through the semiconductor layer. If the doping concentration is not constant throughout the semiconductor layer, then the diffusion of beryllium that occurs during annealing will reduce the sharpness of the doping profile and, moreover, beryllium could diffuse into the active region 5. This diffusion of beryllium will adversely affect the electrical and optical properties of the laser device. This problem is aggravated because the diffusion coefficient increases with the concentration of the dopant. Furthermore, as the beryllium atoms move within the lattice, they will tend to form beryllium precipitates, to cause stacking faults, and to move into interstitial sites thereby reducing the active p-type doping level.

SUMMARY OF THE INVENTION

A first aspect of the present invention provides a semiconductor material comprising a first dopant for providing free charge carriers within the semiconductor material and a second dopant for promoting atomic disorder in the semiconductor material, the concentration of the second dopant being substantially uniform over the volume of the semiconductor material.

The first and second dopants are introduced into the semiconductor material during the growth process. Once the semiconductor material has been. grown it is annealed, and when the material is annealed, the second dopant will diffuse through the lattice of the semiconductor material. The second dopant can initially be introduced into the material with a concentration that is non-uniform over the volume of the material or with a concentration that is substantially uniform throughout the material since, even if the concentration of the second dopant was initially not uniform, after the annealing the concentration of the second dopant will be substantially uniform over the volume of the layer of semiconductor material as a result of the diffusion of the second dopant. The diffusion of the second dopant that occurs during the annealing will reduce the atomic ordering of the semiconductor material. This ensures that the forbidden bandgap of the semiconductor material is not reduced because of atomic ordering effects, and ensures that structural degradation of the semiconductor material will not occur. The presence of the first dopant ensures that there is a high, controllable free carrier concentration in the semiconductor material after the annealing step. Provided that the first dopant does not diffuse through the lattice significantly, the doping profile of the first dopant is not changed by the annealing step.

Co-doping of semiconductor materials—that is, doping a semiconductor material simultaneously with two different dopants—is known, but it has not previously been used for the reason for which it is used in the present invention.

"Journal of Applied Physics" Vol. 76 (12), 1994, pp. 8189–8191 discloses the co-doping of indium gallium nitride films with silicon and zinc. The silicon acts as an impurity to assist radiative recombination, and thereby increases the output of the light emitting diode.

U.S. Pat. No. 5,231,298 discloses a GaAs layer which is co-doped with a p-type dopant and an indium isovalent, isoelectronic dopant. The indium isovalent, isoelectronic dopant is provided to strain the structure of the lattice in a direction opposite to that caused by the p-type dopant.

U.S. Pat. No. 4,889,830 discloses an indium phosphide layer which is doped with zinc. The diffusion of zinc vapour into the indium phosphide layer is carried out in the presence of cadmium vapour, but at a temperature at which only zinc diffuses into the substrate in significant amounts. This method has been found to preserve the surface morphology of indium phosphide during the zinc diffusion process.

Japanese published patent application Nos. 58-053827, 58-056329 and 62-232122 disclose co-doping of GaAs in order to improve the dopant density in the GaAs layer.

U.S. Pat. No. 5,766,981 discloses a method of forming confining regions in a semiconductor laser device having a superlattice active layer. Once the laser device has been fabricated an impurity which promotes intermixing of atoms is diffused into the laser device from its upper surface, and this impurity causes the active region to inter-mix with the adjacent cladding layers so as to lower the refractive index of the inter-mixed regions. These regions of lower refractive index confine light within the central region of the laser.

U.S. Pat. No. 4,871,690 discloses the provision of disordered regions in the substrate of a semiconductor laser device, for example by implanting impurity atoms into regions of the substrate. The laser device is then grown on the substrate, and defects created in the treated areas of the substrate diffuse upwards into the regions of the layers of the laser device that are above the treated areas of the substrate. This will increase the bandgap of these regions.

EP-A-0 475 618 discloses the fabrication of a GaAs/GaAlAs laser device. Layers of ZnO are disposed on the facets of the laser, and zinc diffuses from these layers into the active layer of the device to form window regions.

The concentrations of the first and second dopants may each be within the range $10^{17}$ cm$^{-3}$ to $10^{21}$ cm$^{-3}$.

A second aspect of the present invention provides a semiconductor material containing a first dopant for providing free charge carriers in the semiconductor material and a second dopant for providing atomic disorder in the semiconductor material, the first and second dopant having been introduced into the semiconductor material during the growth of the semiconductor material, wherein the concentration of the second dopant varies over the volume of the semiconductor material.

A layer of semiconductor material according to the second aspect of the invention can be annealed in order to produce a layer of semiconductor material according to the first aspect of the invention. Because the second dopant is introduced into the material such that the concentration of the second dopant varies over the volume of the semiconductor material, the amount of diffusion that occurs when the material is annealed will be increased (during an annealing step, the concentration of the second dopant will tend to equalise itself over the volume of the material). Thus if the concentration of the second dopant before the annealing step is not constant, a greater amount of diffusion will be required to occur during the annealing step in order to equalise the concentration of the second dopant over the volume of the material. Increasing the amount of diffusion will further reduce the atomic ordering of the semiconductor material.

The second dopant may be contained within one or more discrete volumes within the semiconductor material. This is one simple way of increasing the amount of diffusion of the second dopant that occurs during annealing. The second dopant may be contained within one or more δ-doped layers within the semiconductor material. The concentration of the second dopant within the or each δ-doped layer may be within the range $10^{2}$ cm$^{-2}$ to $10^{14}$ cm$^{2}$.

The semiconductor material may be (Al,Ga,In)P. The first dopant may be carbon, and the second dopant may be beryllium, magnesium or zinc. This will produce a p-doped (Al,Ga,In)P layer having, after annealing, a low atomic ordering and thus a large forbidden bandgap. This is suitable for use as, for example, the p-type cladding layer in a laser device such as that shown in FIG. 1.

Carbon is a known p-type dopant for (Al,Ga,In)P, as is disclosed in "Applied Physics Letters" Vol. 71 (8), 1977, pp. 1095–1097. The diffusion coefficient of carbon in (Al,Ga,In)P will be significantly lower than the diffusion coefficient of beryllium in (Al,Ga,In)P. For example, the diffusion coefficient of carbon in GaAs is about two orders of magnitude lower than that for beryllium in GaAs ("Doping in III–V Semiconductors" by E. F. Schubert, p. 190), and a similar result will hold for the diffusion coefficients in (Al,Ga,In)P. Carbon is therefore much less likely to be redistributed during annealing, so that a high p-type carrier concentration will be maintained. Furthermore, since carbon is not significantly redistributed, the sharpness of the doping profile will be retained. The active p-type doping level will also be retained, since the carbon atoms will not move into interstitial sites. The beryllium atoms will diffuse through the lattice during annealing, and this will reduce the atomic ordering of the semiconductor material. Thus, co-doping with both beryllium and carbon, followed by an annealing step, will result in a material which is disordered and has a high, controllable p-type doping profile.

Magnesium or zinc can be used as a p-type dopant in place of beryllium. Magnesium and zinc atoms will diffuse through the semiconductor lattice when it is annealed, and this diffusion will lead to a reduction in atomic ordering.

Alternatively, the first dopant may be silicon, and the second dopant may be selenium, tin or tellurium. These dopants will produce an n-doped material. The silicon will provide a high level of n-doping, and the selenium, tin or tellurium will diffuse through the semiconductor material when it is annealed so as to reduce the atomic ordering.

A third aspect of the present invention provides a semiconductor device comprising a layer of a semiconductor material as defined above. The device may be a semiconductor laser device, and the layer of the semiconductor material may form a cladding layer of the semiconductor laser device.

The laser device may further include a layer of semiconductor material that is not intentionally doped with the second dopant. This reduces the likelihood that the second dopant will diffuse into the active region of the laser device when the device is annealed.

A fourth aspect of the present invention provides a method of fabricating a semiconductor material, comprising the steps of introducing first and second dopants into the semiconductor material during the growth of the semiconductor material, the first dopant being for providing free charge carriers within the semiconductor material, and the second dopant being for promoting atomic disorder within the semiconductor material.

The second dopant may be introduced into the semiconductor material so that the concentration of the second dopant varies over the volume of the semiconductor material.

The method may comprise the step of annealing the semiconductor material at a temperature at which the second dopant is mobile thereby to make the concentration of the second dopant substantially uniform over the volume of the semiconductor material. The annealing step may be carried out at a temperature within the range 500° to 900° C.

The second dopant may be introduced only into one or more discrete volumes of the semiconductor material during the growth of the semiconductor material. The semiconductor material may comprise one or more δ-doped layers of the second dopant before the annealing step is carried out. The concentration of the second dopant in the or each δ-doped layer may be within the range $10^{12}$ cm$^{-2}$ to $10^{14}$ cm$^{-2}$.

The semiconductor material may be (Al,Ga,In)P. The first dopant may be carbon and the second dopant may be beryllium, magnesium or zinc. Alternatively, the first dopant may be silicon and the second dopant may be selenium, tin or tellurium.

The concentrations of the first and second dopants after the annealing step may each be within the range $10^{17}$ cm$^{-3}$ to $10^{21}$ cm$^{-3}$.

A fifth aspect of the present invention provides a method of fabricating a semiconductor laser device comprising growing a layer of semiconductor material using a method as defined above.

The method may further comprise the step of growing a spacer layer between the active region of the laser device and the layer of semiconductor material grown using the method of the invention, the spacer layer being not intentionally doped with the second dopant.

BRIEF DESCRIPTION OF THE DRAWINGS

Preferred embodiments of the present invention will now be described by way of illustrative examples with reference to the accompanying Figures, in which.

DESCRIPTION OF THE PREFERRED EMBODIMENTS

In one embodiment, the present invention is applied to a (Al,Ga,In)P layer. In order to provide a p-doped layer the layer is, in this embodiment, co-doped with carbon and beryllium.

The (Al,Ga,In)P layer can be grown by any conventional semiconductor growth technique that will produce material of suitable quality. In principle, LPE (liquid phase epitaxy), MBE and CVD are methods that can produce high purity material. LPE is, however, less suitable for growing semiconductor layer structures, since this growth technique cannot produce thin layers having a well defined thickness. It is therefore preferred to grow the semiconductor material by MBE or CVD, since these methods can. produce semiconductor layers having high purity and a well defined thickness.

If MBE or CVD growth process is used, a semiconductor material according to the present invention is grown in a similar way to a conventional doped semiconductor material. It is simply necessary to introduce two dopant atomic species into the growth process, rather than one, so that both dopant species are introduced into the semiconductor material as it is grown. A first dopant is to provide free charge carriers in the material, and the second dopant is to promote atomic disorder within the material. The concentration of the first dopant varies over the volume of the material in such a way as to provide the desired profile for the carrier concentration of the material. The second dopant can be introduced into the material with a concentration that is initially non-uniform over the volume of the material, or it can be introduced with a concentration that is substantially uniform throughout the material.

Figure 2:
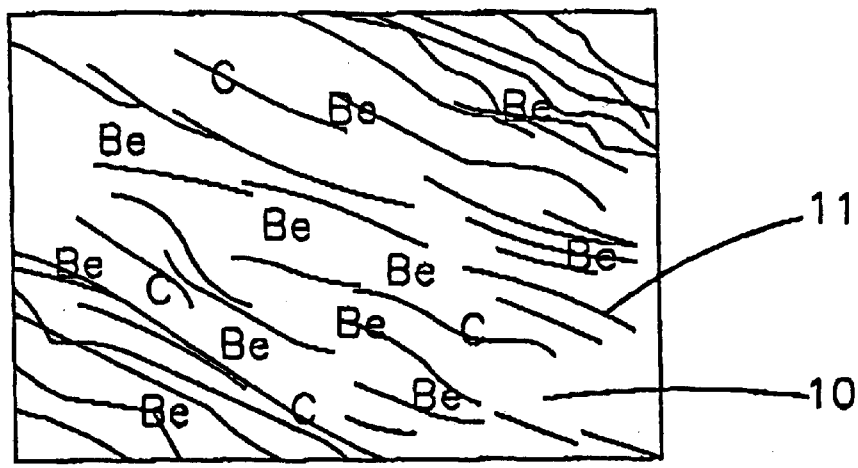
FIG. 2 is a schematic illustration of the structure of a semiconductor material according to an embodiment of the invention before annealing.
Figure 3:
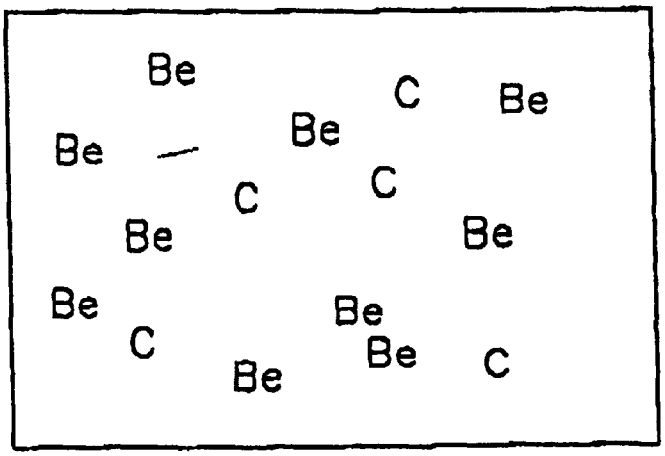
FIG. 3 is a schematic view of the semiconductor material of FIG. 2 after annealing.

When the semiconductor material is grown, it will exhibit atomic ordering. This atomic ordering will give rise to crystal defects, as shown schematically in FIG. 2. The material will contain anti phase domains 10 separated by anti phase domain boundaries 11. The anti phase domains will contain In-rich platelets, in which the bandgap will be reduced. These defects adversely affect the structural and electrical properties of the crystal, and will also affect the bandgap of the material.

If MBE is used, the substrate temperature during the growth process should be between 400° C. and 700° C. For most applications, the doping concentrations for beryllium and carbon should be within the range $10^{17}$ cm$^{-3}$ to $10^{21}$ cm$^{-3}$. The doping concentrations of the two dopants do not need to be equal.

After the semiconductor material has been grown, it is then annealed in order to reduce the atomic ordering in the co-doped material. The temperature during the annealing should be greater than the temperature during the growth process. For a growth temperature of 400° C. to 700° C., a suitable annealing temperature would be between around 500° C. and 900° C. The duration of the annealing step is preferably within the range 1 to 20 minutes, or within the range 10 seconds to 3 minutes if a rapid thermal annealing (RTA) step is used. The annealing is preferably carried out in an inert gas atmosphere.

During the annealing step, the beryllium atoms will diffuse through the semiconductor lattice, thereby decreasing the atomic ordering of the material. The diffusion co-efficient of carbon in (Al,Ga,In)P is much lower than the diffusion co-efficient of beryllium in (Al,Ga,In)P, so that the carbon will not diffuse significantly during the annealing process. The doping profile of the carbon atoms will therefore not be significantly altered. In consequence, the annealed material will have low atomic ordering (owing to the diffusion of beryllium during the annealing step), but will have a high free hole concentration (owing to the carbon dopant atoms) and so will have a high electrical conductivity. The low atomic order means that the bandgap of the material will not be significantly reduced, and the structural properties of the material will not be degraded. The material is therefore suitable for use as, for example, a p-doped cladding layer in a semiconductor laser device.

The present invention is not limited to using beryllium and carbon as the dopant. In general, any combination of dopants can be used provided that one dopant will diffuse through the lattice during the annealing step to reduce the atomic order, and the other dopant will not diffuse significantly during the annealing step. For example, beryllium could be replaced by magnesium or zinc. Magnesium and zinc will both diffuse through the semiconductor lattice during the annealing step.

The present invention can also be used to obtain an n-doped material, by selecting two suitable n-type dopants. Silicon can be used in place of carbon, to provide free electrons within an (Al,Ga,In)P semiconductor layer. The silicon atoms do not diffuse significantly through the lattice during the annealing step. A suitable second dopant for an n-type layer is selenium, tin or tellurium. If these dopant atoms are incorporated into the semiconductor material, they will diffuse through the lattice during the annealing step, so as to reduce the atomic ordering.

The present invention is not limited to the dopant species specifically mentioned above. Any combination of a dopant that diffuses through the lattice during the annealing step and a dopant that generates the required type of charge carrier and does not significantly diffuse during the annealing step can be used.

It is preferable that the first and second dopants are either both n-type or both p-type since, in this case, the overall carrier concentration of the material will be the sum of the carrier concentration produced by the first dopant and the carrier concentration produced by the second dopant. In principle, it would be possible for one of the dopants to be n-type and the other of the dopants to be p-type. It should be noted, however, that in this case one dopant would generate holes and the other dopant would generate electrons, and these would tend to recombine with one another. Thus, the overall carrier concentration in the semiconductor material would be the difference between the carrier concentrations generated by the two dopants.

The amount of atomic disorder that is created as a result of the diffusion of the second dopant during the annealing step depends on the amount of diffusion. It is thus desirable to increase the amount of diffusion of the second dopant as much as possible, since doing so will increase the amount of atomic disorder created.

One way in which the amount of diffusion of the second dopant can be increased is to introduce the second dopant into the semiconductor material so that it has a non-uniform concentration. When the semiconductor material is annealed, the second dopant will diffuse so as to equalise the concentration of the second dopant throughout the semiconductor material. This equalisation effect will be helped because the diffusion coefficient of the second dopant will be greater in the regions where the concentration of the second dopant is high. Thus, providing a variation in the concentration of the second dopant over the volume of the semiconductor material will increase the amount of diffusion, and hence the reduction in atomic ordering, that occurs when the material is annealed.

Figure 4:
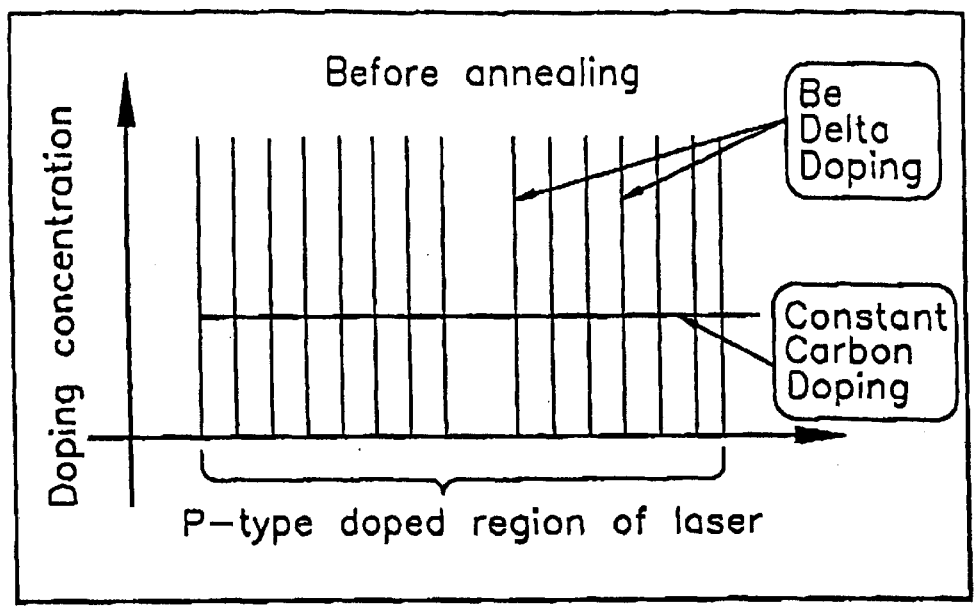
FIG. 4 shows the doping concentration of a semiconductor material according to another embodiment of the present invention before annealing.

A further embodiment of the present invention, in which the second dopant is introduced into the semiconductor material such that it has a non-uniform concentration before the annealing step is carried out, is illustrated in FIG. 4. This is a schematic view of the carrier concentration of the semiconductor material before the annealing step is carried out. It will be seen that the carrier concentration of the first dopant—in this case carbon—is constant throughout the semiconductor layer. The carrier concentration of the second dopant is not constant, however, and consists of a series of "δ-doped layers". Between these δ-doped layers, the doping concentration of the second dopant—in this case beryllium—is substantially zero. Although 15 δ-doped layers are shown in FIG. 4, the invention is not limited to this particular number of δ-doped layers. In principle, any number of δ-doped layers could be used.

A δ-doped layer, also known as a "sheet-doped layer", is formed when the growth of a bulk semiconductor layer is interrupted and only dopant species are supplied to the growth substrate. The production of such a δ-doped layer in GaAs is described in "Proceedings of the 17$^{th}$ International Conference on the Physics of Semiconductors", San Francisco, 1984, pp 325–328. In this example, a δ-doped layer is produced if the growth of n-type GaAs (n≈5×10$^{15}$ cm$^{-3}$) is interrupted for a period of 20–400 seconds whilst only Si atoms are supplied to the substrate. This results in an increase in the two-dimensional doping level of the GaAs to a value equivalent to 2×10$^{18}$ cm$^{-3}$ (for bulkSi). Although this example relates to the production of a δ-doped layer in n-type GaAs, it is applicable also to other semiconductor systems such as the (Al,Ga,In)P system, and to p-doped layers as well as to n-doped layers.

Ideally, the dopant profile of the second dopant (beryllium in this embodiment) would be a series of mathematical δ-functions—that is, the regions doped with beryllium are thin, but have a very high doping concentration of beryllium, for example in the range 10$^{12}$ cm$^{<2}$ to 10$^{14}$ cm$^{-2}$.

The first dopant (carbon in this embodiment) is supplied continuously through the growth process, except that it is not supplied when the δ-doped layers are grown. This will produce a uniform concentration of the first dopant throughout the semiconductor material.

Figure 5:
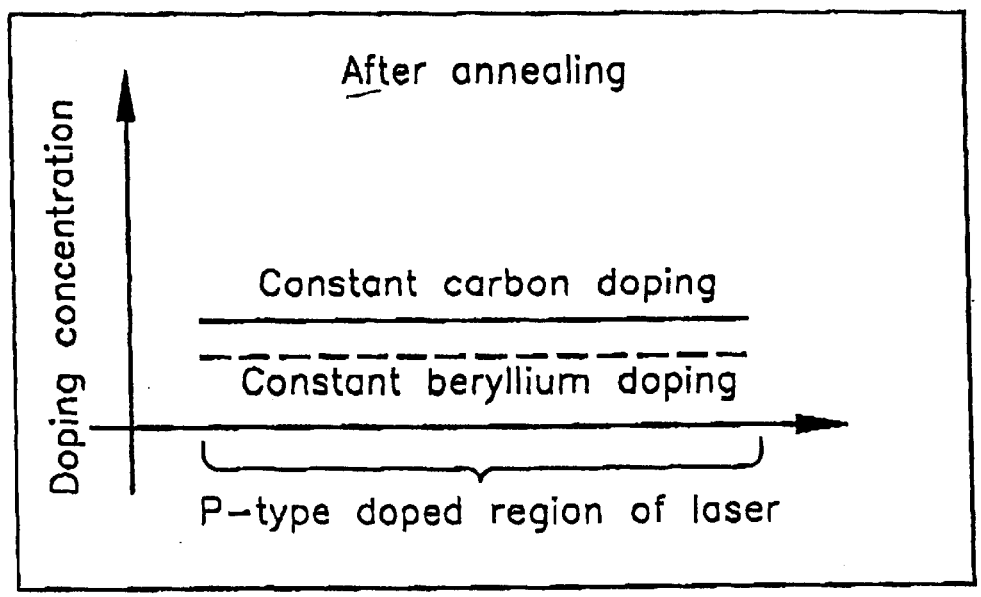
FIG. 5 shows the doping concentration of the material of FIG. 4 after annealing.

Before the semiconductor layer of FIG. 4 is annealed it will exhibit atomic ordering. When the semiconductor layer of FIG. 4 is annealed, the beryllium atoms will diffuse through the lattice. The diffusion coefficient of beryllium increases with the concentration of beryllium, so that the diffusion coefficient at the δ-doped layers will be high. In consequence, the beryllium doping profile will tend to become uniform, giving the doping concentrations shown in FIG. 5. The diffusion of the beryllium will reduce the atomic ordering of the layer.

The amount of atomic disorder that is caused depends on the amount of beryllium diffusion. It is not necessary to use the doping profile shown in FIG. 4 in order to increase the amount of diffusion of the second dopant. In general, any dopant profile having regions of high concentration and regions of low concentration will provide more diffusion of the second dopant compared to a uniform doping profile for the second dopant. Examples of suitable doping profiles include, but are not limited to, a sawtooth profile, a triangular doping profile, or an approximately sinusoidal doping profile.

In the embodiments described above, only one first dopant and one second dopant are used. In principle, however, it would be possible to provide two or more first dopants and/or two or more second dopants. Thus, for example, (Al,Ga,In)P could be doped with carbon, beryllium and magnesium. The carbon would generate free holes in the semiconductor, and the beryllium and magnesium would both diffuse through the lattice when the material is annealed so as to increase the atomic disorder.

Figure 6:
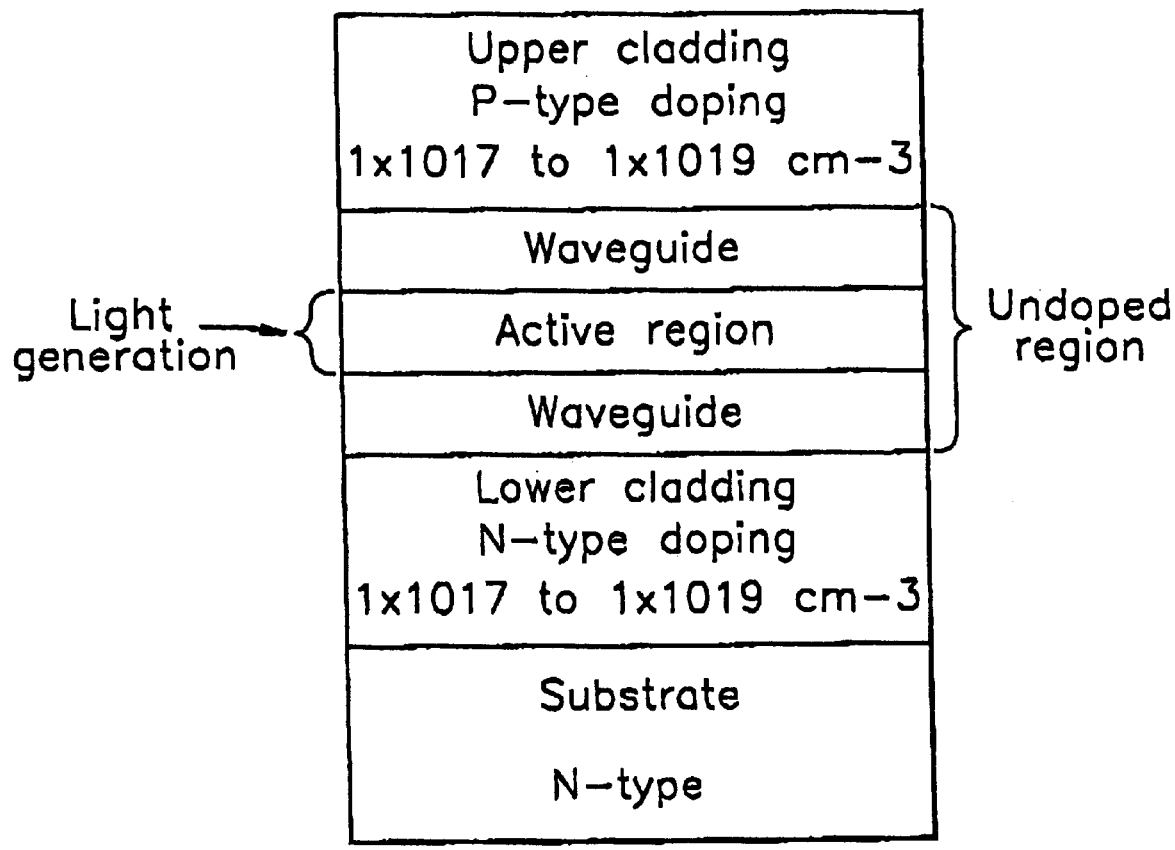
FIG. 6 is a schematic sectional view of a semiconductor laser diode incorporating a co-doped semiconductor layer according to the present invention.

FIG. 6 illustrates a semiconductor laser device according to an embodiment of the invention. This laser device has essentially the same structure as the laser device of FIG. 1, but the upper cladding layer 7 is a co-doped semiconductor layer of the invention. It consists of an (Al$_{0.7}$Ga$_{0.3}$)$_{0.52}$In$_{0.48}$P layer that has been co-doped with, for example, carbon and beryllium to give an overall free hole concentration in the range 1×10$^{17}$ cm$^{-3}$ to 1×10$^{19}$ cm$^{-3}$. The remaining layers 1 to 6 of the laser device of FIG. 6 are the same as for the laser device of FIG. 1.

Figure 1:
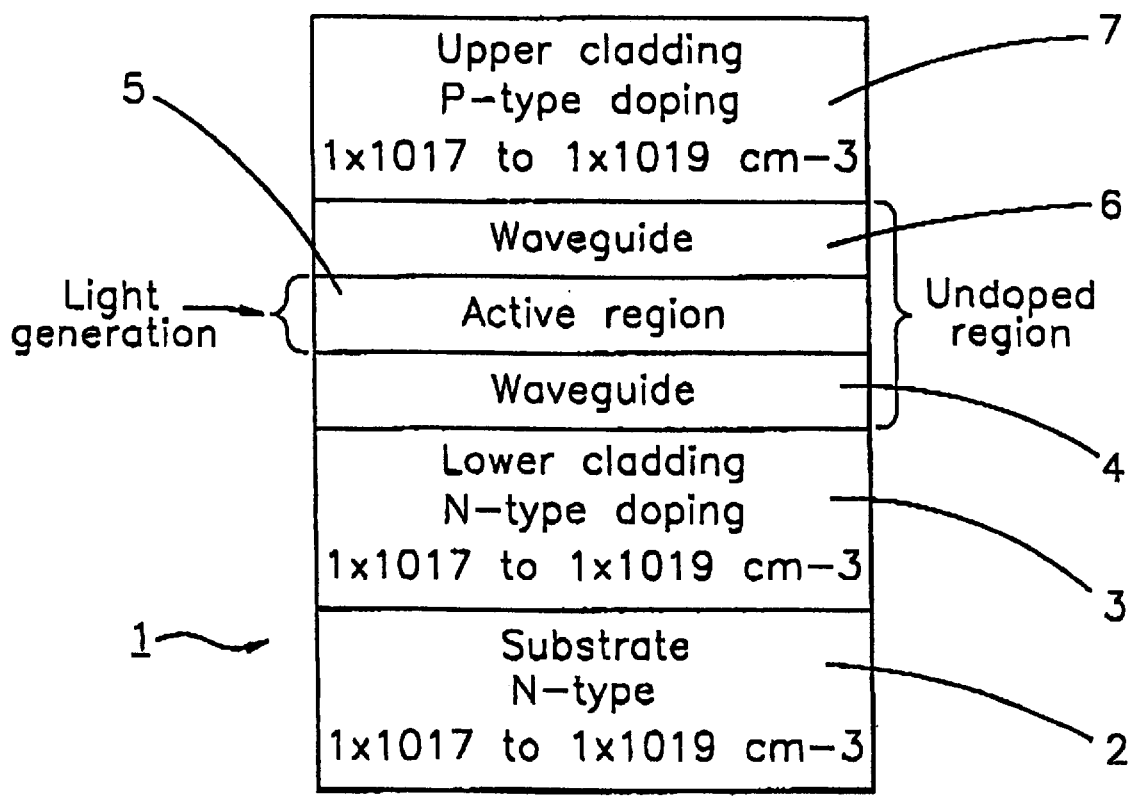
FIG. 1 is a schematic sectional view of a semiconductor laser diode.

In another embodiment, not illustrated, the lower cladding layer 3 of the laser of FIG. 6 is replaced by a co-doped layer, such as an (Al$_{0.7}$Ga$_{0.3}$)$_{0.52}$In$_{0.48}$P layer that has been co-doped with, for example, silicon and tin to give an overall free electron concentration in the range. 1×10$^{17}$ cm$^{-3}$ to 1×10$^{19}$ cm$^{-3}$. In a further embodiment, not illustrated, the laser has the structure shown in FIG. 1 except that the lower cladding layer 3 of the laser of FIG. 1 is replaced by a co-doped layer, such as an (Al$_{0.7}$Ga$_{0.3}$)$_{0.52}$In$_{0.48}$P layer that has been co-doped with, for example, silicon and tin to give an overall free electron concentration in the range 1×10$^{17}$ cm$^{-3}$ to 1×10$^{19}$ cm$^{-3}$.

There is a possibility that the beryllium atoms will diffuse into the active region during the annealing step. To prevent this, in another embodiment of the invention the (Al,Ga,In)P layer is not co-doped over its entire thickness. The layer is doped with the first dopant over its entire thickness, but only the part of the layer away from the active region is intentionally doped with the second dopant. The thickness of the part 7" of the layer that is not intentionally doped with the second dopant is chosen such that the spacing between the part 7' of the layer that is intentionally doped with the second dopant and the active region 5 is large enough to prevent significant diffusion of the second dopant into the active layer 5 as a result of the annealing step. Preferably, the part of the layer that is intentionally doped with the second dopant is spaced from the active region by around 1000 Å (100 nm). Providing this region that is not intentionally doped with the second dopant reduces the likelihood that the second dopant will diffuse into the active region during the annealing step.

Figure 7:
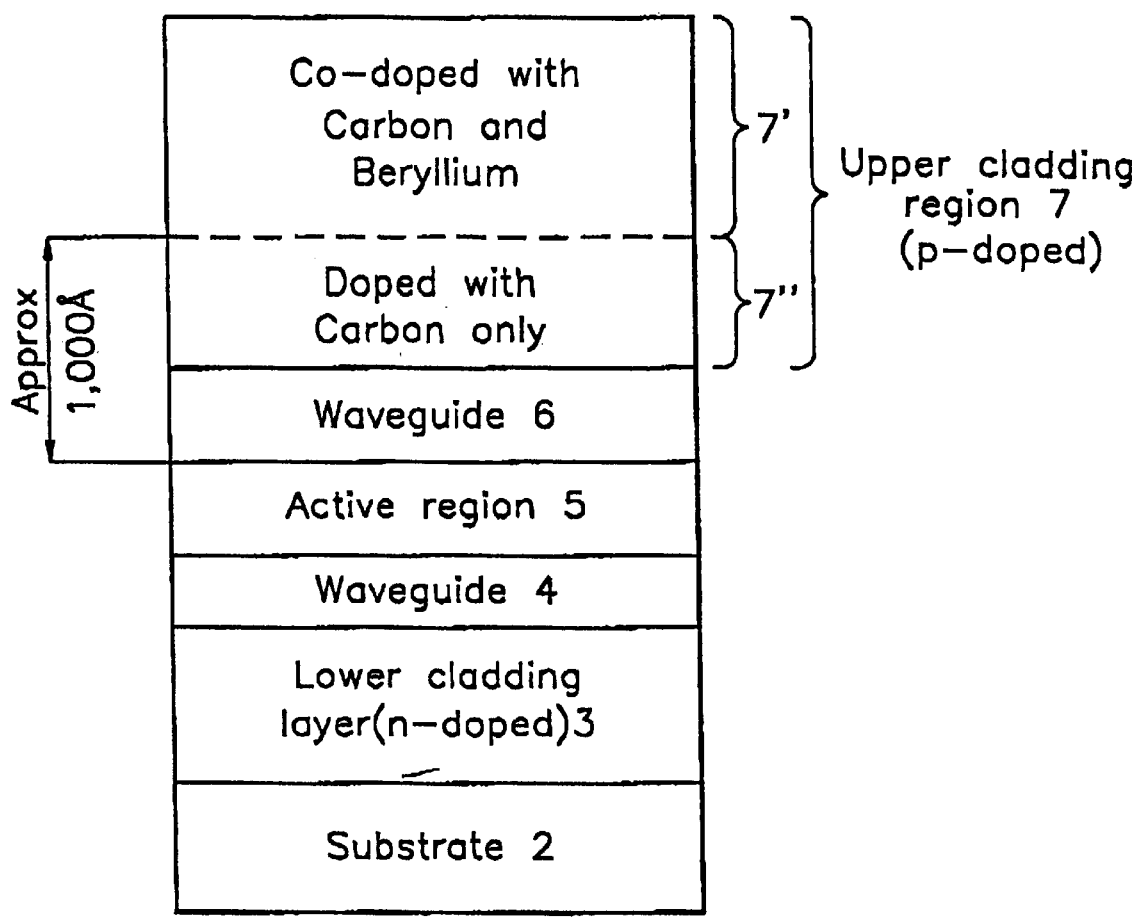
FIG. 7 is a schematic sectional view of a semiconductor laser diode incorporating a co-doped semiconductor layer according to another embodiment of the present invention.

FIG. 7 is a schematic illustration of a semiconductor laser structure, before annealing, incorporating a semiconductor layer according to this embodiment as the p-type cladding layer 7. The part 7' of the p-type cladding layer further from the active layer 5 is co-doped with carbon as the first dopant and beryllium as the second dopant, whereas the part 7" nearer the active region 5 is intentionally doped only with carbon and is not intentionally doped with beryllium. The remaining layers of the laser structure of FIG. 7 are the same as the corresponding layers of the laser shown in FIG. 6.

When the laser structure of FIG. 7 is annealed, the beryllium contained in the co-doped region 7' of the upper cladding layer 7 will diffuse through the cladding layer, into the region 7" initially doped only with carbon. This diffusion will reduce ordering in the cladding layer in the manner described hereinabove. The presence of the part 7" of the upper cladding layer 7 which is doped only with carbon reduces the likelihood that beryllium will diffuse into the active layer.

The concentration of beryllium within the co-doped part 7' of the p-cladding layer 7. is preferably non-uniform before annealing so as to increase the diffusion of beryllium that occurs during annealing, but the co-doped part 7' of the p-cladding layer 7 could be grown with a uniform beryllium concentration.

The present invention has been described above with particular reference to the (Al,Ga,In)P system. However, the present invention is not limited to this particular semiconductor system. The present invention can be applied to any semiconductor system in which atomic ordering causes significant undesirable defects. Examples of other systems to which the invention could be applied include the (Al,Ga,In)As and (Al,Ga,In) (N,As,P) systems.

What is claimed is:

1. A semiconductor material containing a first dopant for providing free charge carriers in the semiconductor material and a second dopant for promoting atomic disorder in the semiconductor material, the first and second dopants having been incorporated in the semiconductor material during the growth of the semiconductor material, the concentration of the second dopant being substantially uniform over the volume of the semiconductor material, whereby the semiconductor material exhibits both a high electrical conductivity and a low atomic ordering, after an appropriate annealing procedure has been carried out.

2. A semiconductor material as claimed in claim 1, wherein the concentrations of the first and second dopants are each within the range $10^{17}$ cm$^{-3}$ to $10^{21}$ cm$^{-3}$.

3. A semiconductor material as claimed in claim 1, wherein the semiconductor material is (Al,Ga,In)P.

4. A semiconductor material as claimed in claim 1, wherein the first dopant is carbon and the second dopant is beryllium, magnesium or zinc.

5. A semiconductor material as claimed in claim 1, wherein the first dopant is silicon, and the second dopant is selenium, tin or tellurium.

6. A semiconductor device comprising a layer of a semiconductor material as defined in claim 1.

7. A semiconductor device as claimed in claim 6, wherein the device is a semiconductor laser device.

8. A semiconductor device as claimed in claim 7, wherein the layer of the semiconductor material comprises a cladding layer of the semiconductor laser device.

9. A semiconductor device as claimed in claim 7, wherein the device further includes a layer of semiconductor material that is not intentionally doped with the second dopant.

10. A semiconductor material containing a first dopant for providing free charge carriers in the semiconductor material and a second dopant for promoting atomic disorder in the semiconductor material, the first and second dopant having been incorporated in the semiconductor material during the growth of the semiconductor material, and wherein the concentration of the second dopant varies over the volume of the semiconductor material, whereby the semiconductor material exhibits both a high electrical conductivity and a low atomic ordering, after an appropriate annealing procedure has been carried out.

11. A semiconductor material as claimed in claim 10, wherein the second dopant is contained within one or more discrete volumes within the semiconductor material.

12. A semiconductor material as claimed in claim 11, wherein the second dopant is contained within one or more δ-doped layers within the semiconductor material.

13. A semiconductor material as claimed in claim 12, wherein the concentration of the second dopant within the or each δ-doped layer is within the range $10^{12}$ cm$^{-2}$ to $10^{14}$ cm$^{-2}$.

14. A semiconductor material as claimed in claim 10, wherein the semiconductor material is (Al,Ga,In)P.

15. A semiconductor material as claimed in claim 10, wherein the first dopant is carbon and the second dopant is beryllium, magnesium or zinc.

16. A semiconductor material as claimed in claim 10, wherein the first dopant is silicon, and the second dopant is selenium, tin or tellurium.

17. A semiconductor device comprising a layer of a semiconductor material as defined in claim 10.

18. A semiconductor device as claimed in claim 17, wherein the device is a semiconductor laser device.

19. A semiconductor device as claimed in claim 18, wherein the layer of the semiconductor material comprises a cladding layer of the semiconductor laser device.

20. A semiconductor device as claimed in claim 18, wherein the device further includes a layer of semiconductor material that is not intentionally doped with the second dopant.

* * * * *